US011682896B2

(12) United States Patent
Demarie et al.

(10) Patent No.: US 11,682,896 B2
(45) Date of Patent: Jun. 20, 2023

(54) FAULT DETECTION IN REDUNDANT POWER SUPPLIES

(71) Applicant: International Business Machines Corporation, Armonk, NY (US)

(72) Inventors: Mark L. Demarie, Poughkeepsie, NY (US); Luke L. Jenkins, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 109 days.

(21) Appl. No.: 17/341,621

(22) Filed: Jun. 8, 2021

(65) Prior Publication Data
US 2022/0393499 A1   Dec. 8, 2022

(51) Int. Cl.
*H02H 7/12* (2006.01)
*H02H 1/00* (2006.01)
*H02J 9/00* (2006.01)

(52) U.S. Cl.
CPC .......... *H02H 7/12* (2013.01); *H02H 1/0007* (2013.01); *H02J 9/005* (2013.01)

(58) Field of Classification Search
CPC ...... H02H 1/0007; H02H 1/0038; H02H 3/36; H02H 7/10; H02H 7/12; H02H 7/1206; H02H 7/1213; H02H 7/22; H02H 7/26; H02H 7/266–268; H02J 1/082–102; H02J 1/108; H02J 9/0058; H02J 9/04; H02J 9/061; H02M 1/008; H02M 1/0083; H02M 1/325; H02M 1/0043
See application file for complete search history.

(56) References Cited

U.S. PATENT DOCUMENTS

| | | | |
|---|---|---|---|
| 5,548,463 A | 8/1996 | Aldridge et al. | |
| 5,672,958 A * | 9/1997 | Brown | H02J 1/10 |
| | | | 363/69 |
| 6,000,042 A | 12/1999 | Henrie | |
| 6,035,261 A | 3/2000 | Carpenter et al. | |
| 6,249,411 B1 * | 6/2001 | Hemena | H02J 1/108 |
| | | | 361/18 |

(Continued)

FOREIGN PATENT DOCUMENTS

EP   1466510 B1   9/2017

OTHER PUBLICATIONS

K. R. Covi, "Three-loop feedback control of fault-tolerant power supplies in IBM Enterprise System/9000 processors," in IBM Journal of Research and Development, vol. 36, No. 4, pp. 781-789, Jul. 1992, doi: 10.1147/rd.364.0781. (Year: 1992).*

(Continued)

*Primary Examiner* — Fred E Finch, III
(74) *Attorney, Agent, or Firm* — Cantor Colburn LLP; Tihon Poltavets (57) ABSTRACT

Embodiments include redundant power supplies and method for fault detection in a redundant power supply. Aspects include monitoring a voltage at local output nodes of each phase of the redundant power supply, wherein the local output nodes are each connected to an output bus of the redundant power supply via a feedback path. Aspects also include creating an alert that a phase associated with the local output node has failed based on a determination that the voltage at the local output node is within a fault range.

13 Claims, 8 Drawing Sheets

(56) References Cited

U.S. PATENT DOCUMENTS

| | | | |
|---|---|---|---|
| 6,275,958 B1 | 8/2001 | Carpenter et al. | |
| 6,301,133 B1* | 10/2001 | Cuadra | H02J 1/102 363/65 |
| 6,407,899 B1 | 6/2002 | Carpenter | |
| 6,967,487 B2 | 11/2005 | Garnett | |
| 7,849,351 B2 | 12/2010 | Karam et al. | |
| 8,319,471 B2 | 11/2012 | Adest et al. | |
| 8,867,184 B2 | 10/2014 | Kitchener et al. | |
| 9,548,627 B1 | 1/2017 | King, Jr. et al. | |
| 10,168,721 B2 | 1/2019 | Muccini et al. | |
| 2003/0081438 A1* | 5/2003 | Dinh | H02J 1/102 363/127 |
| 2004/0039536 A1* | 2/2004 | Garnett | G01R 31/40 702/58 |
| 2004/0075600 A1* | 4/2004 | Vera | H02M 1/10 341/166 |
| 2005/0035656 A1 | 2/2005 | Kuramochi et al. | |
| 2005/0078424 A1* | 4/2005 | Yamamura | H02J 1/10 361/91.1 |
| 2007/0029979 A1* | 2/2007 | Williams | G05F 1/66 323/217 |
| 2008/0266740 A1* | 10/2008 | Smith | H02J 1/10 323/283 |
| 2014/0035375 A1* | 2/2014 | Vogman | H02M 7/04 307/64 |
| 2014/0132233 A1* | 5/2014 | Park | H02M 1/38 323/272 |
| 2014/0277802 A1* | 9/2014 | Tomas | G06F 1/28 700/292 |
| 2015/0205338 A1* | 7/2015 | Cho | G06F 1/30 713/300 |
| 2016/0342546 A1* | 11/2016 | Sonnaillon | G06F 13/4282 |
| 2017/0117715 A1* | 4/2017 | Muccini | H02J 5/00 |
| 2017/0123445 A1* | 5/2017 | Muccini | G06F 1/26 |
| 2018/0115174 A1* | 4/2018 | Fahlenkamp | H02M 1/32 |
| 2019/0146569 A1* | 5/2019 | Nge | G06F 1/28 713/320 |
| 2021/0336544 A1* | 10/2021 | Wang | H02M 1/08 |
| 2021/0408911 A1* | 12/2021 | Upadhyaya | G06F 1/26 |

OTHER PUBLICATIONS

Juergen Carstens, "A Driver Circuit Redundancy Design for Power Supply Module"IPCOM000187569D, Sep. 25, 2009. 6 Pages.

* cited by examiner

FAULT DETECTION IN REDUNDANT POWER SUPPLIES

BACKGROUND

This disclosure relates to redundant power supplies, and more specifically, to fault detection in redundant power supplies.

A power supply, sometimes known as a power supply unit or PSU, is a device or system that supplies electric power to an output load or group of loads. A power supply may be configured to convert power from one form to another form, such as converting AC electric power to regulated DC electric power or from one power level to another. The regulation of power supplies is typically done by incorporating circuitry to tightly control the output voltage and/or current of the power supply to a specific value. The specific value is closely maintained despite variations in the load presented to the power supply's output, or any reasonable voltage variation at the power supply's input.

For high availability systems, it is often desirable that a single failure will not cause the system to be unavailable. One solution is to provide redundant power by using two or more separate power supplies. This solution has the advantage of being very reliable since if one power supply fails, the other can pick up the load of the failed power supply. Two or more power supplies are often used as an additional layer of redundancy in case of a power bus fault. Redundant power systems often require the detection of faults to indicate loss of redundancy. As most general integrated circuits (IC) for power supplies are not designed for redundant applications, they have no means to detect such system states. Furthermore, in power supplies that include monitoring signals (such as "power good" or "fault" signals), the monitoring signals are often incorrect due to the nature of redundant topologies, which results in false reporting of positive states.

BRIEF SUMMARY

In one or more example embodiments of the invention, a method for fault detection in redundant power supplies is disclosed. The method includes monitoring a voltage at local output nodes of each phase of the redundant power supply, wherein the local output nodes are each connected to an output bus of the redundant power supply via a feedback path. Aspects also include creating an alert that a phase associated with the local output node has failed based on a determination that the voltage at the local output node is within a fault range.

In one or more example embodiments of the invention, a redundant power supply includes a plurality of phases, wherein each phase is connected to an input bus and an output bus. Each of the plurality of phases includes an input protection circuit coupled to the input bus and a local input node, an output protection circuit coupled to the output bus and a local output node, and a feedback path from the output bus to the local output node, the feedback path including sense line resistor, a diode, and a local diode resistor connected in series.

In one or more example embodiments of the invention, a redundant power supply includes a first phase connected to an input bus and an output bus. The first phase includes a first input protection circuit coupled to the input bus and a first local input node, a first output protection circuit coupled to the output bus and a first local output node, and a first feedback path from the output bus to the local output node, the feedback path including a first sense line resistor, a first diode, and a first local diode resistor connected in series. A second phase connected to an input bus and an output bus, the second phase includes a second input protection circuit coupled to the input bus and a second local input node, a second output protection circuit coupled to the output bus and a second local output node, and a second feedback path from the output bus to the local output node, the feedback path including a second sense line resistor, a second diode, and a second local diode resistor connected in series.

BRIEF DESCRIPTION OF THE SEVERAL VIEWS OF THE DRAWINGS

The subject matter regarded as the invention is particularly pointed out and distinctly claimed in the concluding portion of the specification. The invention, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numbers may be repeated among the figures to indicate corresponding or analogous features.

DETAILED DESCRIPTION

Exemplary embodiments generally include redundant power supplies having fault detection circuits. In redundant power systems, independent power supplies (referred to herein as "phases") are configured in parallel with one another. Each phase includes protection circuits to isolate the phase during a fault event. As a result of the added protection circuitry, each phase includes a local output voltage node. In exemplary embodiments, the output is each phases of the redundant power supplies is normally connected via a feedback loop to a switch-mode power supply (SMPS) to a remote sense point. Then the link between the remote sense and local output voltage is made.

Figure 1:
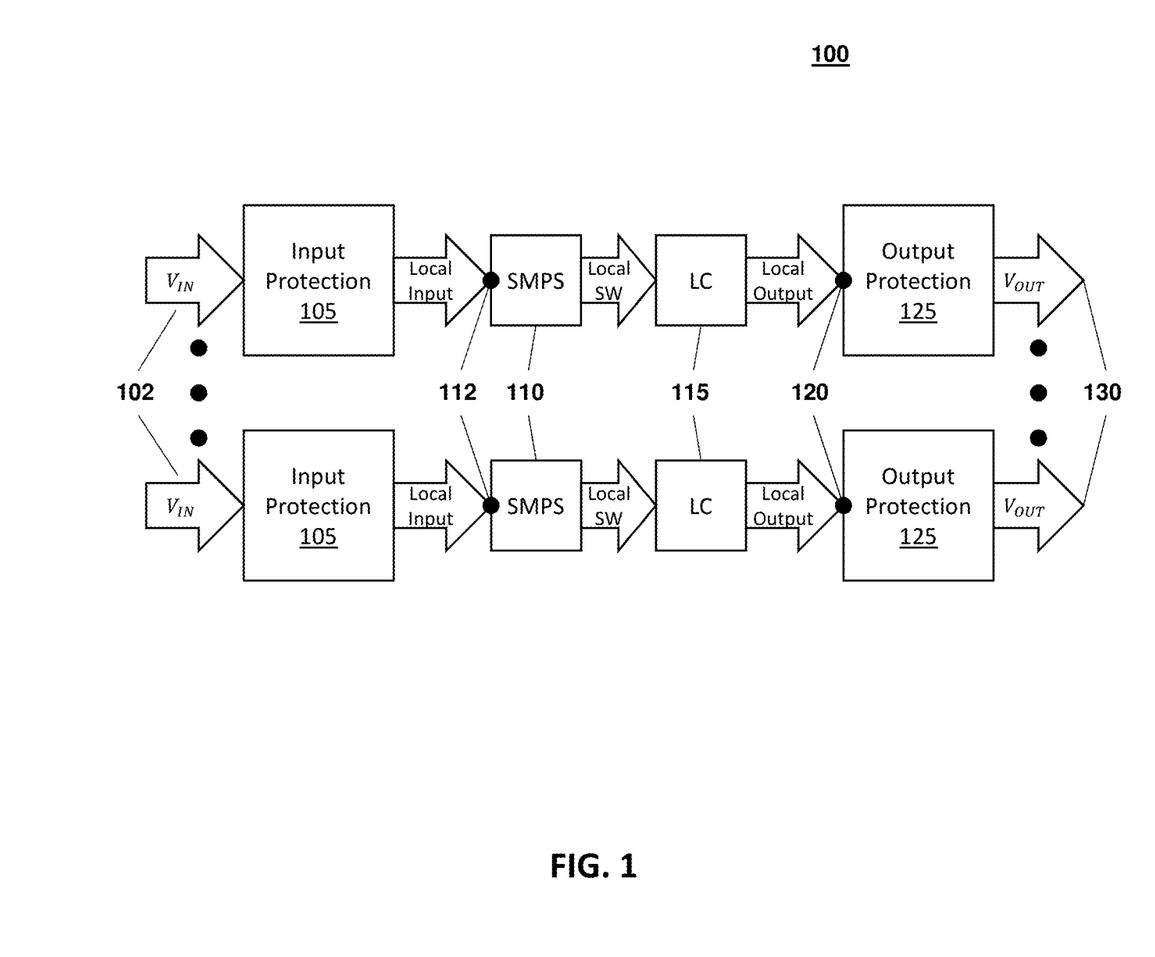
FIG. 1 depicts a block diagram of a redundant power supply environment in accordance with one embodiment.

Referring now to FIG. 1, a redundant power supply 100 having two phases is shown. As illustrated, each phase includes an input voltage ($V_{in}$) 102 connected to an input protection circuit 105, such as an electronic fuse, which outputs a local input voltage ($V_{in\_Local}$) 112. The local voltage input is provided to a switch-mode power supply 110, which is configured to transform a type/level of $V_{in\_Local}$ to a desired voltage type/level. Next, an inductor-capacitor (LC) low-pass filter 115 is used to create the local voltage output ($V_{out\_Local}$) 120. The local voltage output 120 is provided to the output protection circuit 125, such as a OR'ing circuit, which in turn outputs the output voltage ($V_{out}$) 130.

Figure 2A:
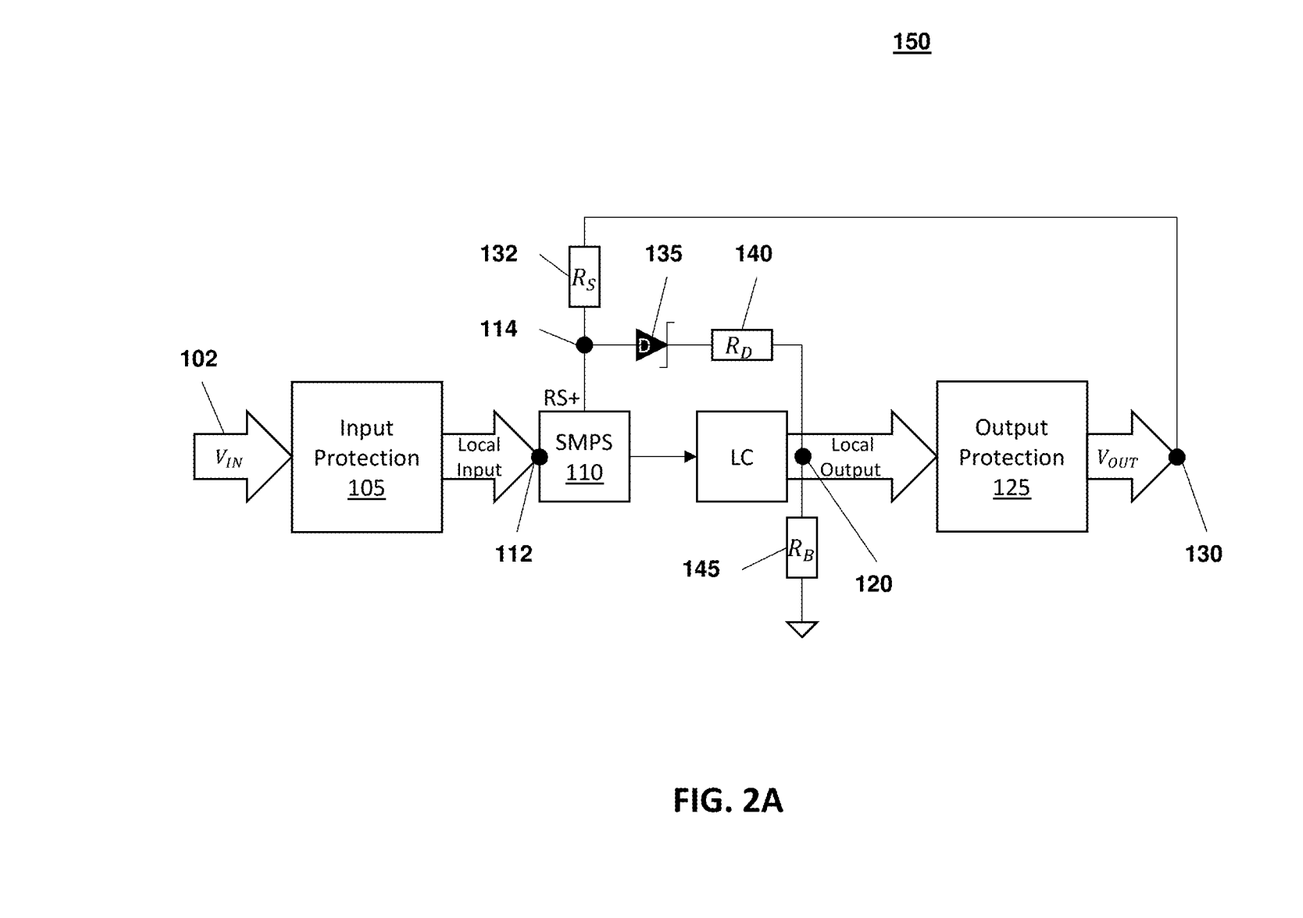
FIG. 2A depicts one phase of a redundant power supply having fault detection circuitry in accordance with one embodiment.

Referring now to FIG. 2A, one phase 150 of a redundant power supply in accordance with an embodiment of is shown. As illustrated, phase 150 includes additional passive components that are configured to act as a monitoring circuit. The additional passive components include a sense line resistor ($R_S$) 132, a diode (D) 135, a local diode resistor ($R_D$) 140, and a bleed resistor ($R_B$) 145. In exemplary embodiments, a feedback path is provided from output voltage 130 through the sense line resistor 132, the diode 135, and the local diode resistor 140 to the local voltage output 120 node. Without diode 135 and the local diode resistor ($R_D$) 140, as long as one phase active. i.e., holding up the output voltage 130, every other phase will believe they are in regulation, which can result in a false positive status if a phase is faulted.

Figure 2B:
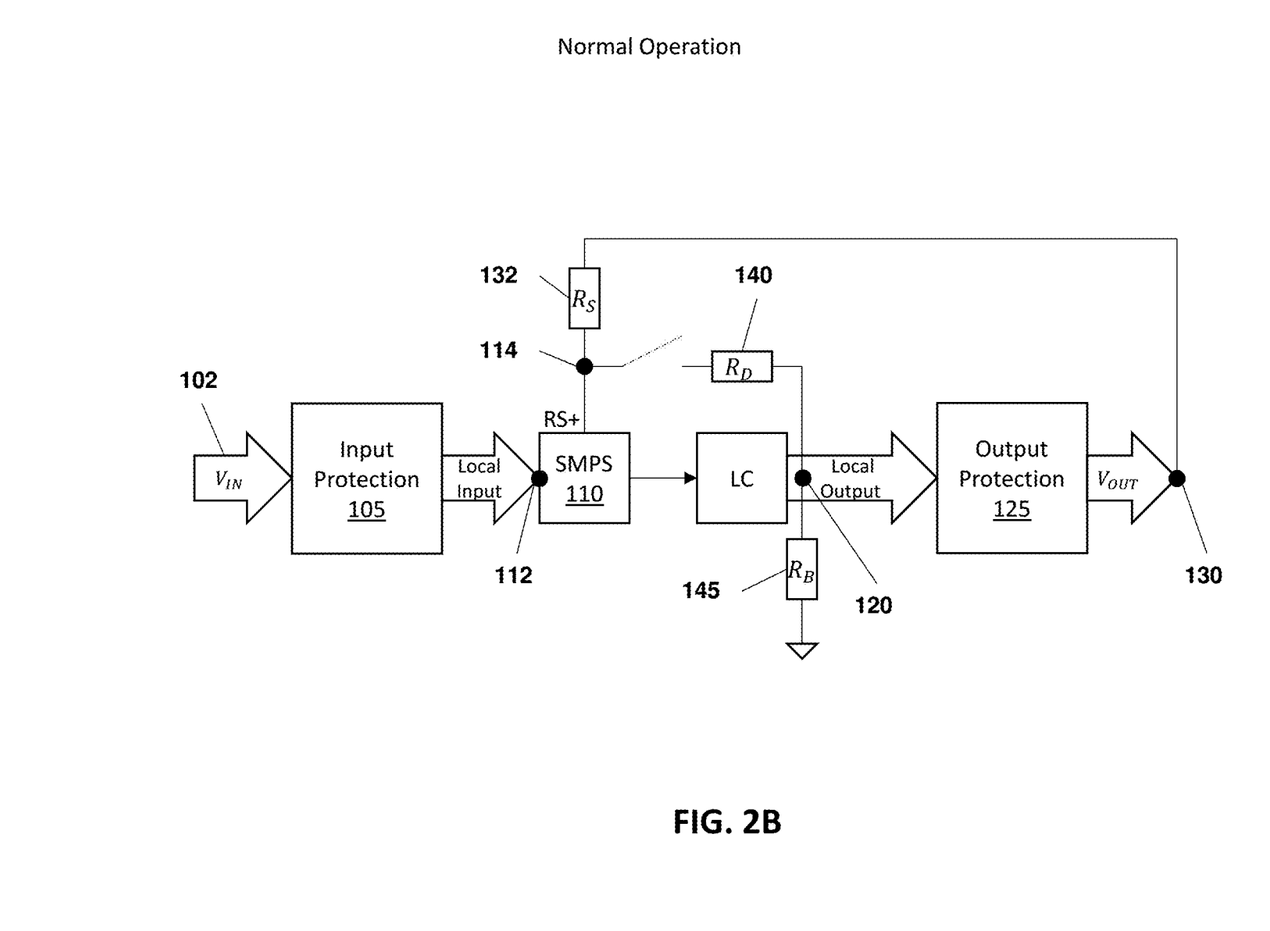
FIG. 2B depicts one phase of a redundant power supply having fault detection circuitry during a normal state in accordance with one embodiment.
Figure 2C:
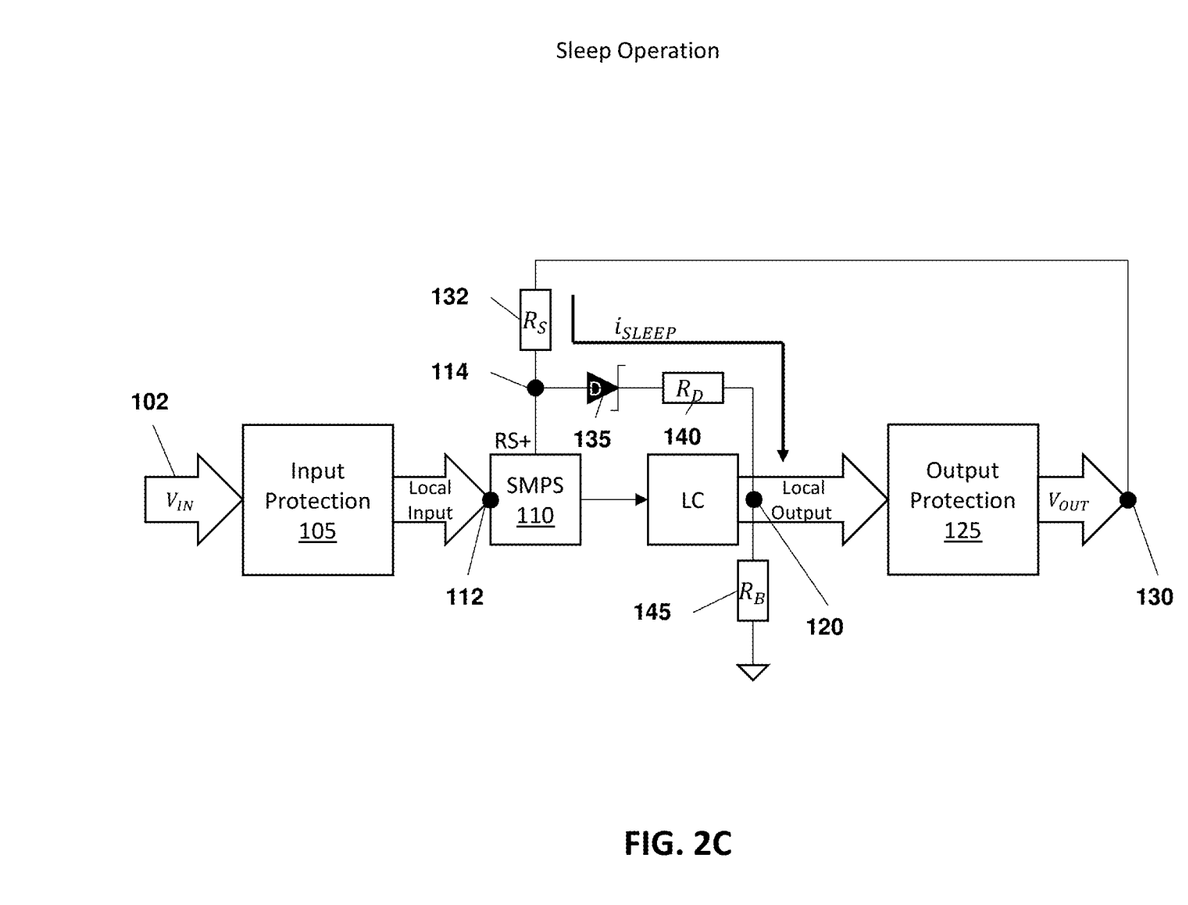
FIG. 2C depicts one phase of a redundant power supply having fault detection circuitry during a sleep state in accordance with one embodiment.
Figure 2D:
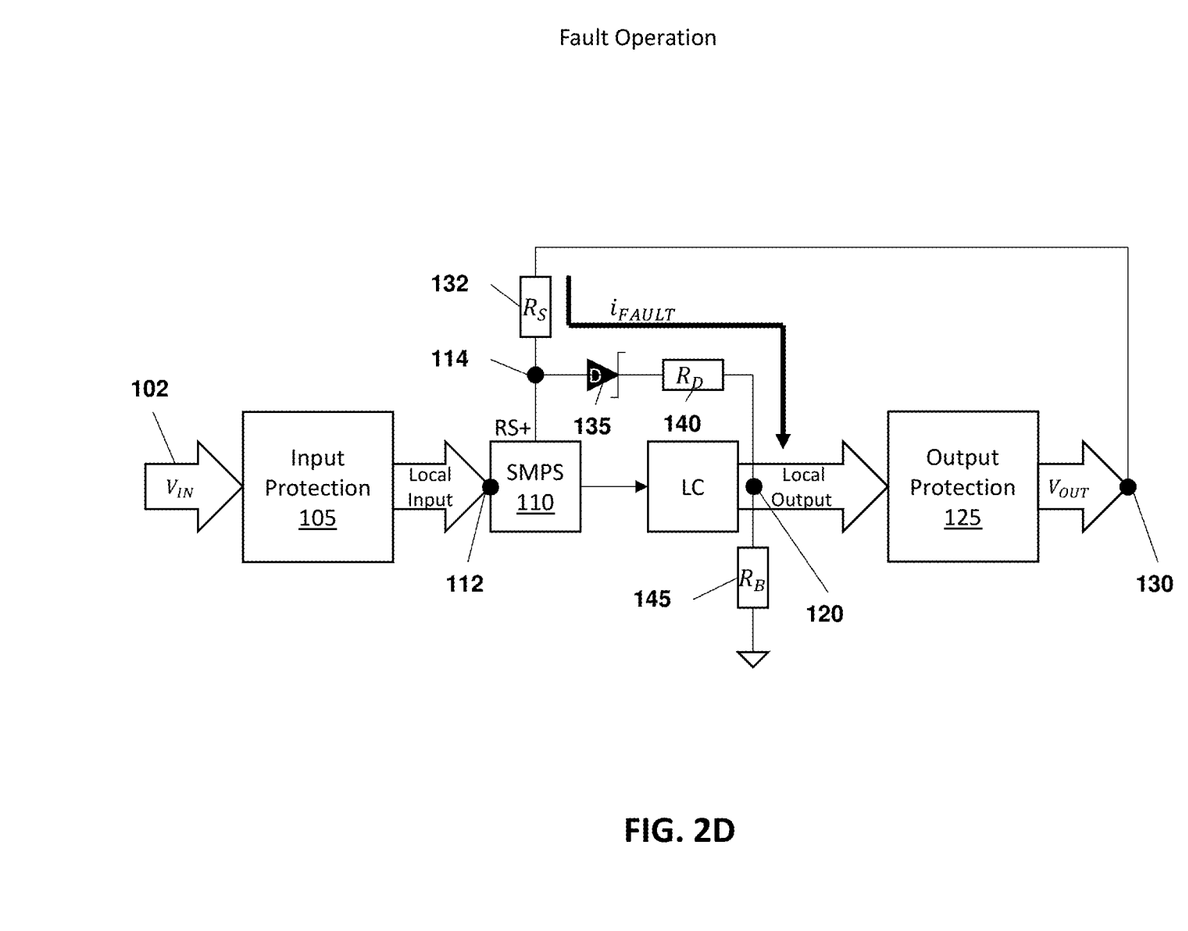
FIG. 2D depicts one phase of a redundant power supply having fault detection circuitry during a fault state in accordance with one embodiment.

FIGS. 2B, 2C, and 2D illustrate the operation of phase 150 of a redundant power supply during normal, sleep, and fault states of phase 150, respectively. In exemplary embodiments, the set of blocks shown in FIG. 2A would be copied and paralleled for a redundant architecture where the input voltage ($V_{in}$) 102 and the output voltage ($V_{out}$) 130 are common between the phases.

During a normal operational state of phase 150 of a redundant power supply, as shown in FIG. 2B, the local output voltage 120 is greater than the voltage at a remote sense output 114 of the SMPS 110. As a result, the diode 135 acts as an open circuit that prevents current flow across the local diode resistor ($R_D$) 140. Accordingly, the voltage of the local output voltage 120 is completely supported by the voltage at the remote sense output 114 of the SMPS 110. In other words, during normal operation, the local output voltage 120 is not supported by the output voltage 130 of other phases of the redundant power supply. During the normal operation state, the voltage level of the local output voltage 120 is within the ON range, which is naturally higher than the output voltage 130.

In exemplary embodiments, while a phase is not faulted, but not contributing to the power (referred to as the sleeping state) the local output voltage 120 will decrease. During the sleep state of phase 150 of a redundant power supply, as shown in FIG. 2C, the local output voltage 120 is lower than the voltage at a remote sense output 114 of the SMPS 110 because the voltage of the local output voltage 120 is supported by the output voltage 130. In the sleep state, the diode 135 allows current flow ($i_{SLEEP}$) across the local diode resistor ($R_D$) 140, which will prevent the local output voltage 120 from falling far below output voltage 130. During the sleep state, the voltage level of the local output voltage 120 is within a SLEEP range, which is configured to be lower than the output voltage 130. In exemplary embodiments, during the sleep state, the voltage level of the local output voltage 120 is kept at a minimum voltage that can be calculated by the voltage drops across $R_S$, $R_D$, $R_B$ & D. In one embodiment, $R_S$ and $R_D$ are sized ($R_S$ small enough and $R_D$ large enough), such that the local output voltage 120 is just over a diode drop below $V_{out}$.

In exemplary embodiments, the entire series combination of $R_S$-D-$R_D$-$R_B$ path will conduct a current path ($i_{FAULT}$) as the voltage at a remote sense output 114 of the SMPS 110 no longer contributes to the local output voltage 120. This means that the local output voltage 120 is no longer restricted to be approximately equal to $V_{out}$. During the fault state, the voltage level of the local output voltage 120 is within a FAULT range, which is configured to be lower than the output voltage 130. In exemplary embodiments, the local output voltage 120 being within the FAULT range is used to conclude that a fault has occurred in the phase and to indicate a loss of redundancy. In exemplary embodiments, the R components in the series can be adjusted to tune the boundaries of the ON, SLEEP, and FAULT ranges.

Figure 2E:
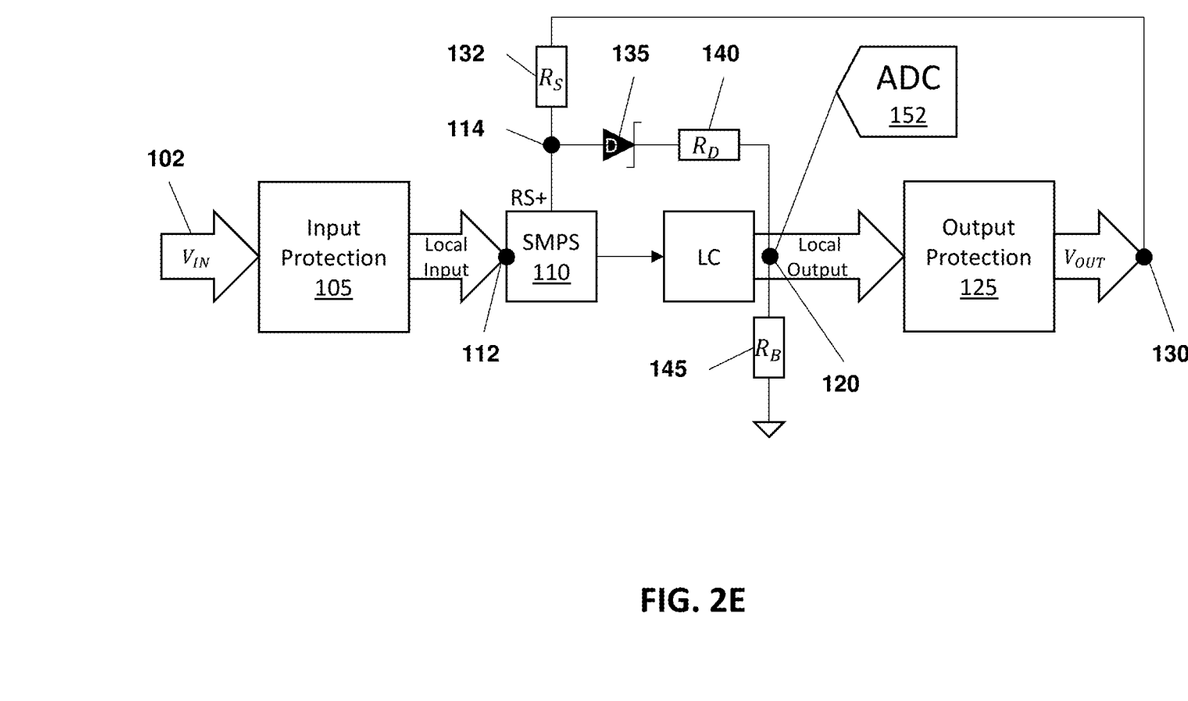
FIG. 2E depicts one phase of a redundant power supply having fault detection circuitry and a monitoring circuit in accordance with one embodiment.

Referring now to FIG. 2E, one phase 100 of a redundant power supply having fault detection circuitry and a monitoring circuit in accordance with the present disclosure is shown. In exemplary embodiments, the monitoring circuit includes an analog-to-digital converter (ADC) 152 that is configured to monitor the voltage level of the local output voltage 120. In another embodiment, the monitoring circuit includes a comparator circuit. In exemplary embodiments, the ADC 152 is a multi-channel ADC that is configured to monitor the voltage level of the local output voltage 120 for several phases simultaneously. In exemplary embodiments, one or more thresholds can be set to indicate that a phase has entered a sleeping or faulted state.

Figure 3:
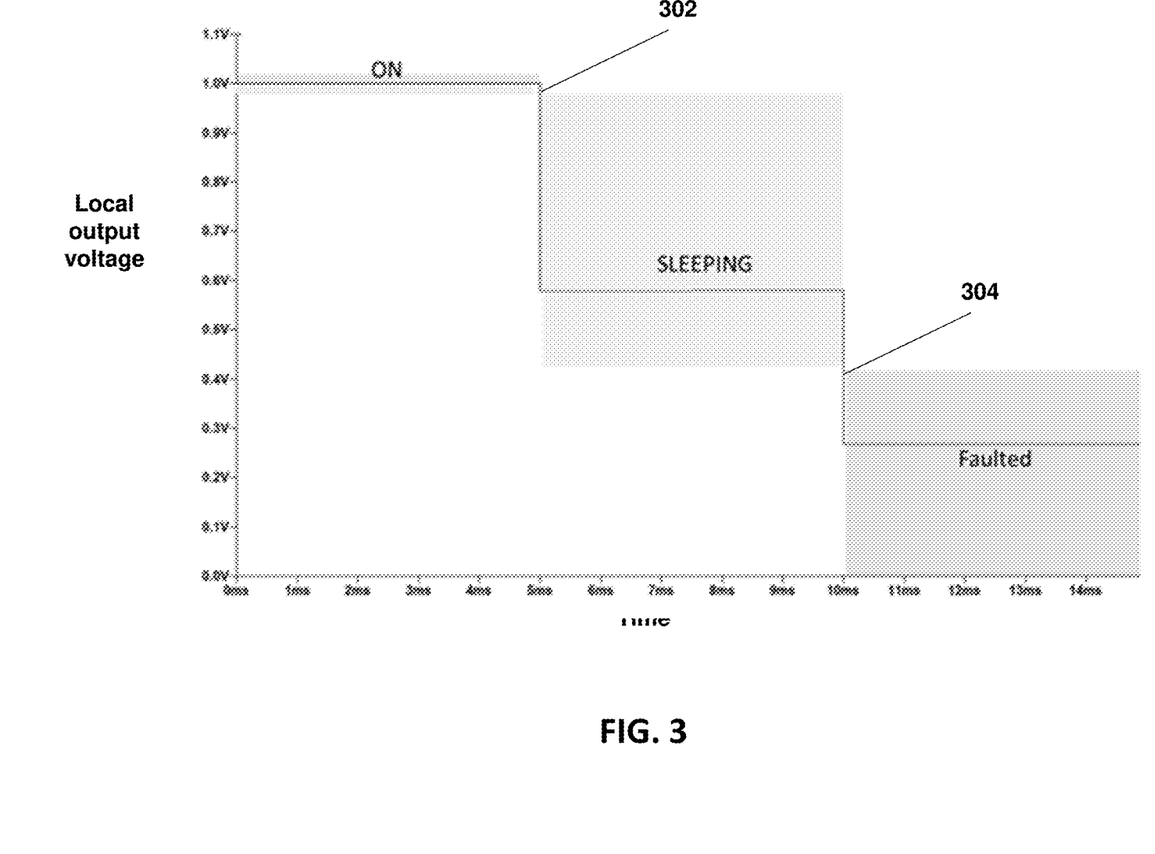
FIG. 3 depicts a graph showing the value of the local output voltage in various states in accordance with one embodiment.

Referring now to FIG. 3, a graph showing the value of the local output voltage 120 in various states in accordance with an embodiment is shown. In one example, the output voltage 130 is configured to be approximately 1V, Rs is selected to be 200 ohms, the diode is a Schottky diode, Rd is selected to be 30.1 ohms, and Rb is selected to be 200 ohms. In this embodiment, the local output voltage 120 during the normal operating mode is approximately 1V and the ON voltage range is defined as the local output voltage 120 being above a first threshold value 302, e.g. 0.95V. The local output voltage 120 during the sleeping operating mode is approximately 0.6V and the SLEEP voltage range is defined as the local output voltage 120 being below the threshold value 302, e.g. 0.95V, and above a second threshold value 304, e.g., 0.4V. The local output voltage 120 during the faulted operating mode is approximately 0.3V and the FAULT voltage range is defined as the local output voltage 120 being below the second threshold value 304, e.g., 0.4V.

In exemplary embodiments, phase state detection is obtained by adding a small set of passive components to each phase of a redundant power supply. These passive components, along with the fault protection of the phase, create a tri-state local output voltage. This tri-state local output voltage is used to monitor the state of each phase and thereby the redundancy status of the redundant power supply. Accurate monitoring of the redundancy status of the redundant power supply, allows proactive measures to prevent failure of the redundant power supply and unscheduled repair actions, which will save money and prevent customer dissatisfaction.

Figure 4:
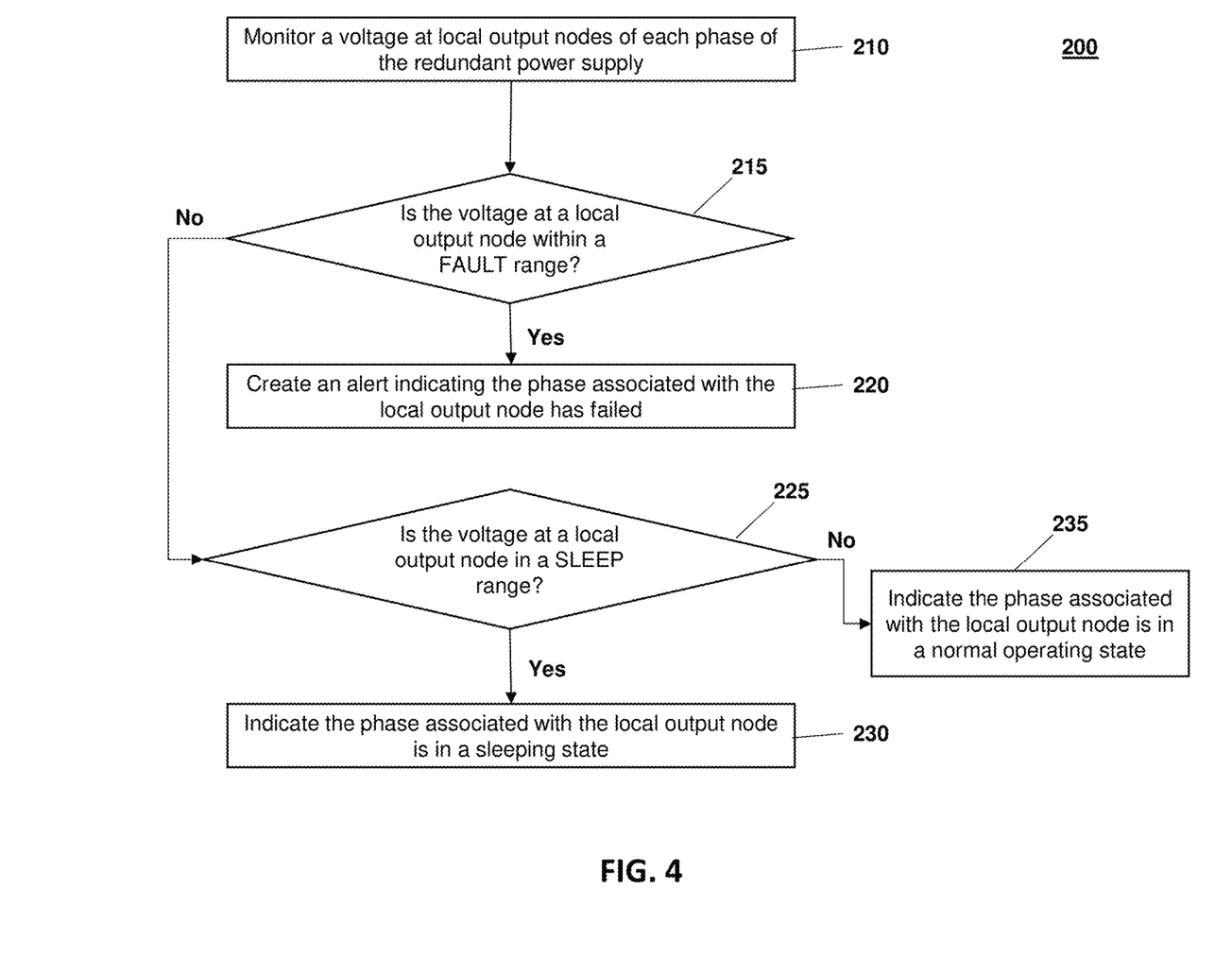
FIG. 4 depicts a flow chart diagram of a method of fault detection in a redundant power supply in accordance with one embodiment.

FIG. 4 depicts a flow chart diagram of a method 200 for fault detection in a redundant power supply in accordance with the present disclosure. In exemplary embodiments, the redundant power supply includes a plurality of phases that are each connected to an input bus and an output bus. Each of the plurality of phases includes an input protection circuit coupled to the input bus and a local input node and an output protection circuit coupled to the output bus and a local output node. In exemplary embodiments, each of the plurality of phases includes a feedback path from the output bus to the local output node, the feedback path including a sense line resistor, a diode, and a local diode resistor connected in series. As illustrated at block 210, the method 200 includes monitoring a voltage at local output nodes of each phase of the redundant power supply.

Next, as shown at decision block 215, the method 200 includes determining if the voltage at a local output node is within a FAULT range. If the voltage at a local output node is within the FAULT range, the method 200 proceeds to block 220 and includes creating an alert indicating the phase associated with the local output node has failed. Otherwise, the method 200 proceeds to decision block 225 and includes determining if the voltage at a local output node is within a SLEEP range. If the voltage at a local output node is within the SLEEP range, the method 200 proceeds to block 230 and includes indicating the phase associated with the local output node is in a sleeping state. Otherwise, the method 200 proceeds to block 235 and includes indicating that the phase associated with the local output node is in a normal operating state.

In exemplary embodiments, each of the local output nodes are connected to ground via bleed resistors, and one or more of the first threshold value 302 and the second threshold value 304 are determined based at least in part on a resistance of the sense line resistor, the local diode resistor, and the bleed resistor. In exemplary embodiments, a multichannel analog-to-digital converter connected to the local output nodes of each phase of the redundant power supply is configured to monitor a voltage at local output nodes of each phase of the redundant power supply.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

What is claimed is:

1. A method for fault detection in a redundant power supply, the method comprising:
    monitoring a voltage at local output nodes of each phase of the redundant power supply, wherein the local output nodes are each connected to an output bus of the redundant power supply via a feedback path;

based on a determination that the voltage at the local output node is within a fault range, creating an alert that a phase associated with the local output node has failed; and based on a determination that the voltage at the local output node is within a sleep range, indicating that the phase associated with the local output node is in a sleeping state.

2. The method of claim 1, wherein the feedback path includes a sense line resistor, a diode, and a local diode resistor connected in series.

3. The method of claim 2, wherein each of the local output nodes is connected to ground via bleed resistors.

4. The method of claim 3, wherein the fault range is determined based at least in part on a resistance of the sense line resistor, the local diode resistor, and the bleed resistor.

5. The method of claim 1, further comprising indicating that the phase associated with the local output node is in a normal state based on a determination that the voltage at the local output node is within an on range.

6. A redundant power supply comprising:
plurality of phases, wherein each phase is connected to an input bus and an output bus; each of the plurality of phases comprising:
an input protection circuit coupled to the input bus and a local input node;
an output protection circuit coupled to the output bus and a local output node;
a feedback path from the output bus to the local output node, the feedback path including sense line resistor, a diode, and a local diode resistor connected in series; and
a multi-channel analog-to-digital converter (ADC) connected to the local output node of each phase of the redundant power supply, wherein the ADC is configured to monitor a voltage level at the local output node of each of the plurality of phases;
wherein the ADC is further configured to indicate a phase of the plurality of phases is in a sleeping state based on a determination that the voltage level at the local output node associated with the phase is within a sleep range.

7. The redundant power supply of claim 6, wherein the ADC is further configured to create an alert that a phase of the plurality of phases has failed based on a determination that the voltage level at the local output node associated with the phase is within a fault range.

8. The redundant power supply of claim 7, wherein the fault range includes a voltage below a first threshold value.

9. The redundant power supply of claim 8, wherein the first threshold value is based at least in part on a resistance of the sense line resistor and the local diode resistor.

10. The redundant power supply of claim 9, wherein the local output node of each of the plurality of phases are connected to ground via a bleed resistor and wherein the first threshold value is further based at least in part on a resistance of the Need resistor.

11. A redundant power supply comprising:
a first phase connected to an input bus and an output bus, the first phase comprising:
a first input protection circuit coupled to the input bus and a first local input node;
a first output protection circuit coupled to the output bus and a first local output node; and
a first feedback path from the output bus to the local output node, the feedback path including a first sense line resistor, a first diode, and a first local diode resistor connected in series;
a second phase connected to the input bus and the output bus, the second phase comprising:
a second input protection circuit coupled to the input bus and a second local input node;
a second output protection circuit coupled to the output bus and a second local output node;
a second feedback path from the output bus to the local output node, the first feedback path including a second sense line resistor, a second diode, and a second local diode resistor connected in series; and
a multi-channel analog-to-digital converter (ADC) connected to the local output node and the second local output node, wherein the ADC is configured to monitor a voltage level at the first local output node and the second local output node;
wherein the ADC is further configured to indicate the first phase in a sleeping state based on a determination that the voltage level at the first local output node is within the sleep range.

12. The redundant power supply of claim 11, wherein the ADC is further configured to create an alert that the first phase has failed based on a determination that the voltage level at the first local output node is within a fault range.

13. The redundant power supply of claim 12, wherein the fault range is determined based at least in part on a resistance of the first sense lire resistor, the first local diode resistor, and the first bleed resistor.

* * * * *